(12) United States Patent  (10) Patent No.: US 8,179,483 B2
Katoh  (45) Date of Patent: May 15, 2012

(54) LIQUID CRYSTAL DISPLAY DEVICE

(75) Inventor: Hiromi Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 319 days.

(21) Appl. No.: 12/596,541

(22) PCT Filed: Feb. 22, 2008

(86) PCT No.: PCT/JP2008/053091
§ 371 (c)(1),
(2), (4) Date: Oct. 19, 2009

(87) PCT Pub. No.: WO2009/011147
PCT Pub. Date: Jan. 22, 2009

(65) Prior Publication Data
US 2010/0110350 A1  May 6, 2010

(30) Foreign Application Priority Data
Jul. 13, 2007  (JP) .................................. 2007-185027

(51) Int. Cl.
*G02F 1/1335*  (2006.01)
(52) U.S. Cl. ......................................................... 349/12
(58) Field of Classification Search ..................... 349/12
See application file for complete search history.

(56) References Cited

U.S. PATENT DOCUMENTS

| | | | |
|---|---|---|---|
| 5,243,177 A | 9/1993 | Fujimagari | |
| 6,069,674 A | 5/2000 | Aomori | |
| 7,408,598 B2 * | 8/2008 | den Boer et al. | 349/53 |
| 2005/0045881 A1 | 3/2005 | Nakamura | |
| 2005/0134751 A1 | 6/2005 | Abileah et al. | |
| 2006/0192766 A1 | 8/2006 | Nakamura | |

OTHER PUBLICATIONS

International Search Report for PCT/JP2008/053091, mailed Mar. 18, 2008.
Nakamura et al., "A TFT-LCD with Image Capture Function Using LTPS Technology", AMD1-4, IDW '03, 2 pages.
Hayashi et al., "Optical Sensor Embedded Input Display Usable Under High-Ambient-Light Conditions", SID 07 Digest, 3 pages.

* cited by examiner

*Primary Examiner* — James Dudek
(74) *Attorney, Agent, or Firm* — Nixon & Vanderhye P.C.

(57) ABSTRACT

A liquid crystal display device of the present invention includes a liquid crystal display panel (10) in which a liquid crystal layer (13) is arranged between an active matrix substrate (11) and a counter substrate (12). A plurality of optical sensors (16) are provided in respective image display regions of the liquid crystal display panel (10), each of the optical sensors (16) having a light receiving section (16*d*) for detecting transmitted light through a panel surface of the liquid crystal display panel (10). The liquid crystal display panel (10) is a transflective type panel and the optical sensors (16) are provided in respective reflective display regions (R) of the transflective type panel. Further, a reflective electrodes (34) provided above the respective optical sensors (16) serve as light shielding layers so as to shut out light which enters the light receiving section (16*d*) in an oblique direction. Moreover, an aperture (34*a*) is provided in a part of each of the reflective electrodes (34) so that the light receiving section (16*d*) can detect light from directly above.

7 Claims, 5 Drawing Sheets

LIQUID CRYSTAL DISPLAY DEVICE

This application is the U.S. national phase of International Application No. PCT/JP2008/053091, filed 22 Feb. 2008, which designated the U.S. and claims priority to Japanese Patent Application No. 2007-185027, filed 13 Jul. 2007 the entire contents of each of which are hereby incorporated by reference.

TECHNICAL FIELD

The present invention relates to a liquid crystal display device. In particular, the present invention relates to a liquid crystal display device including a display panel in which an optical sensor is provided for detecting light on a panel surface of the display panel.

BACKGROUND ART

A flat panel type display device typified by a liquid crystal display device is characterized by thin-lightweight and low power consumption, etc. Further, technical development is promoted for improving display performances such as a colonization, a high definition, and/or a moving picture processing. Accordingly, at present, such a flat panel type display device is widely incorporated in an electronic device such as a mobile phone, a PDA, a DVD player, a mobile game machine, a laptop PC, a PC monitor, or a TV.

In these circumstances, in these years, a liquid crystal display device has been developing in which an optical sensor element is provided in each pixel (alternatively in one of pixels RGB) in a image display region (for example, refer to Patent Literature 1, Non Patent Literatures 1 and 2). In a case where an optical sensor element is thus provided in each pixel, even a normal liquid crystal device can achieve a scanning function and a touch panel function. That is, the optical sensor element serves as an area sensor.

CITATION LIST

Patent Literature 1
Japanese Patent Application Publication, Tokukai, No. 2004-318819 A (Publication Date: Nov. 11, 2004)
Non Patent Literature 1
H. Hayashi et al., "Optical Sensor Embedded Input Display Usable under High-Ambient-Light Conditions", SID 07 DIGEST pp. 1105-1108 (May, 2007)
Non Patent Literature 2
T. Nakamura et al., "A TFT-LCD with Image Capture Function using LTPS Technology", SID 03 pp. 1661-1662 (May, 2003)

SUMMARY OF INVENTION

However, in a case where an image of such as an image of a document placed on a panel surface is scanned with use of an optical sensor element, a problem of a deterioration in resolution occurs because the optical sensor element and the image (subject) to be scanned are structurally separated from each other to some extent due to a glass and a polarization plate provided between the optical sensor element and the image to be scanned. This problem occurs because of the following reason. Namely, since the image to be scanned is separated from the optical sensor element, isotropic light enters a light receiving section of the optical sensor via the panel surface. It follows that the optical sensor scans not only an image directly above the optical sensor but also an image obliquely above the optical sensor.

For example, in a case where a fingerprint is scanned precisely, it is preferable that the optical sensor element and the hand (i.e., the image to be scanned) are contacted with each other. Alternatively, it is preferable that the optical sensor element and the hand are separated from each other by a distance of at most approximately 100 μm to 200 μm. Note however that the polarization plate provided on the surface of the liquid crystal display panel has normally a thickness of approximately 100 μm. As such, it is difficult to keep the distance, within the above range, between the optical sensor element and the image to be scanned. Accordingly, a desired resolution cannot be obtained, thereby leading to a problem that an image cannot be scanned precisely.

The present invention is accomplished in view of the problem, and its object is to improve a resolution of an optical sensor, which is provided in an image display region of a liquid crystal display device.

In order to attain the object, a liquid crystal display device of the present invention includes: a liquid crystal display panel in which a liquid crystal layer is arranged between an active matrix substrate and a counter substrate, a plurality of optical sensors being provided in respective image display regions of the liquid crystal display panel, each of the optical sensors having a light receiving section for detecting light transmitted through a surface of the liquid crystal display panel, a light shielding layer being provided above each of the optical sensors so as to shut out light which enters the light receiving section in an oblique direction, and an aperture being provided in a part of each of the light shielding layers, via which aperture each of the optical sensors can detect light which enters each of the light receiving sections from directly above.

The liquid crystal display device of the present invention includes, in the respective image display regions of the liquid crystal display panel, the plurality of the optical sensors which can detect the light transmitted through the surface of the liquid crystal display panel. The liquid crystal display device of the present invention is a liquid crystal display device which uses the plurality of the optical sensors as area sensors for achieving various functions such as a scanning function and a touch panel function.

Further, in the liquid crystal display device of the present invention, the light shielding layer is provided above each of the optical sensors, and the light shielding layer has the aperture. The light shielding layer shuts out light which enters the light receiving section of the optical sensor in an oblique direction. The aperture is formed so that light from directly above can enter the light receiving section of the optical sensor.

In the configuration, the light shielding layer having the aperture is provided so that the optical sensor can mainly receive light from the surface of the liquid crystal display panel provided directly above the optical sensor. According to the configuration, even though the image to be scanned placed on the surface of the liquid crystal display panel is away from the optical sensors, it is possible to prevent a deterioration in resolution occurred by scanning the image obliquely above. Therefore, the present invention can improve the resolution of the optical sensor.

In the liquid crystal display device of the present invention, it is preferable that: the liquid crystal display panel is a transflective type panel; the optical sensors are provided in respective reflective display regions; and reflective electrodes provided in the respective reflective display regions serve as the respective light shielding layers.

In the configuration, the optical sensors are provided in the respective reflective display regions, so as not to diminish an aperture ratio of each pixel of the liquid crystal display panel. Accordingly, a display quality of the liquid crystal display device can be secured. Moreover, since the reflective electrodes formed in the respective reflective display regions can be used as the respective light shielding layers, it is not necessary to provide separate light shielding layers.

The transflective type liquid crystal display panel indicates a liquid crystal display panel which carries out a display in a transmissive mode and a reflective mode.

In the liquid crystal display device of the present invention, it is preferable that: the optical sensors are constituted by respective diodes; and the light shielding layers are respective metal layers which cover the respective diodes and which have respective apertures via which light externally enters parts of the respective diodes.

Further, in the liquid crystal display device of the present invention, it is preferable that: the optical sensors are respective PIN diodes in each of which a $p^+$ semiconductor layer, an i semiconductor layer, and an $n^+$ semiconductor layer are arranged in this order: and the light shielding layers are respective metal layers, each of the metal layers being provided above the $p^+$ layer and the $n^+$ layer of a corresponding one of the PIN diodes; and the apertures are formed between adjacent ones of the metal layers.

In the configuration, the light shielding layers can be provided the in vicinity to the respective optical sensors, thereby reducing an amount of stray light which is to be detected by each of the optical sensors.

The metal layer is, for example, a source metal. With the configuration, since the source metal which is provided, in advance, in the liquid crystal display panel can be used as the light shielding layers, it is not necessary to form separate light shielding layers.

In the liquid crystal display device of the present invention, it is preferable that a width S is Pd/f or more but 2Pd/f or less, where S is a width of each of the apertures, f is a distance between the surface of the liquid crystal display panel and each of the optical sensors, d is a distance between the respective light shielding layers and, the respective optical sensors; and P is a distance between adjacent two of the optical sensors.

If the width S is set so as to be smaller than the lower limit Pd/f, it is not possible to have an effect of improving a resolution, in view of geometric optics. The lower limit Pd/f is also a minimum value which allows each of the optical sensors to have its own area in which it should partially recognize an image on the panel surface so that the entire area to be recognized can be completely recognized. In a case where the width S is designed to be the lower limit Pd/f, the area from which each of the optical sensors receives light is the same as an area defined by the distance P (the distance between adjacent two optical sensors). Accordingly, even when the width S is smaller than Pd/f, areas on the panel surface from which areas adjacent two of the optical sensors receive light do not overlap each other.

With the configuration, the following effects can be achieved. Specifically, in a case where the width S is Pd/f or more, (i) it is possible to improve a resolution and (ii) the optical sensors can completely detect light via the entire panel surface.

In contrast, in a case where the width S is larger than the lower limit Pd/f, the areas, from which adjacent two of the optical sensors receive light, start to overlap each other. Further, in a case where the width S is larger than the upper limit 2Pd/f, areas, from which (i) an optical sensor and (ii) an optical sensor geometric-optically next to the adjacent optical sensor (i.e., an n-th optical sensor and, an (n+2)-th optical sensor) receive light, start to overlap each other. That is, in a case where the width S is larger than the upper limit 2Pd/f, the areas, from which (i) the optical sensor and (ii) the optical sensor geometric-optically next to the adjacent optical element sensor receive light, overlap each other, thereby causing a deterioration in resolution.

Accordingly, in a case where the width S is 2Pd/f or less, (i) it is possible to prevent an optical sensor from receiving light from the panel surface directly above its adjacent optical sensor and (ii) it is possible to prevent areas, from which (a) an optical sensor and (b) an optical sensor geometric-optically next to the adjacent optical sensor receive light, from overlapping each other. This allows an improvement in resolution of the optical sensors.

Note that, in a case where the light shielding layer is a metal layer, the width S of the aperture indicates a distance between the metal layers formed above the $p^+$ layer and the $n^+$ layer, respectively. Further, in a case where a part of the distance is different from the other part, the width S of the aperture indicates a distance between mostly separated parts.

Moreover, in a case where the light shielding layer is formed by a reflective electrode, the width S of the aperture indicates a width in an alignment direction (vertical or horizontal) of optical sensors arranged next to each other.

For a fuller understanding of the nature and advantages of the invention, reference should be made to the ensuing detailed description taken in conjunction with the accompanying drawings.

Figure 9:
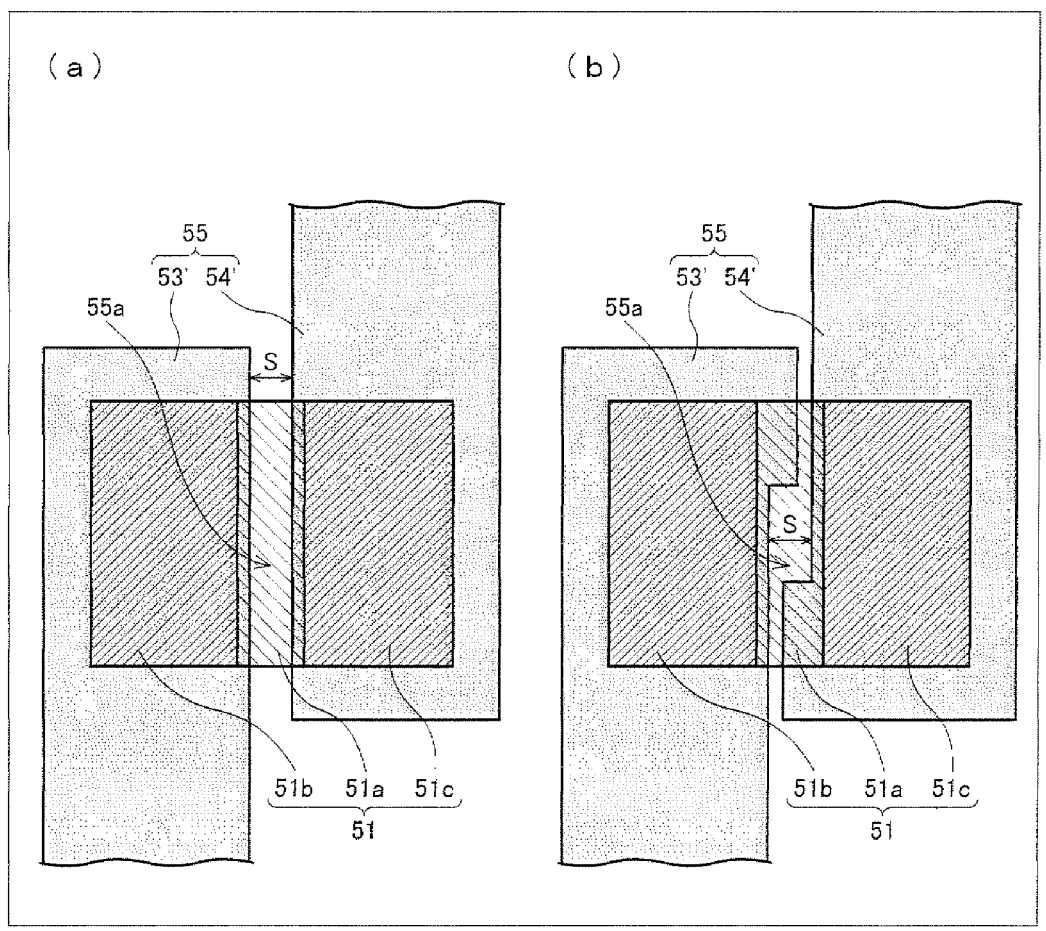

Each of (a) and (b) of FIG. 9 is a plain view illustrating an example of a structure of an optical sensor included in the liquid crystal display device in the second embodiment of the present invention.

REFERENCE SIGNS LIST

10: Liquid. Crystal Display Panel
10a: Liquid Crystal Display Panel

11: Active Matrix Substrate
11a: Active Matrix Substrate
12: Counter Substrate
13: Liquid Crystal Layer
16: Optical Sensor
16a: Optical Sensor Element (Optical Sensor)
16d: Light Receiving Section
32: TFT
33: Pixel Electrode
34: Reflective Electrode (Light Shielding Layer)
34a: Aperture
51: Semiconductor Film (Semiconductor Layer)
51a: i-layer
51b: p$^+$-layer
51c: n$^+$-layer
53': p-side Electrode (Light Shielding Layer, Metal Layer)
54': n-side Electrode (Light Shielding Layer, Metal Layer)
55: Light Shielding Layer
55a: Opening (Aperture)
R: Reflective Display Region
T: Transmissive Display Region

DESCRIPTION OF EMBODIMENTS

First Embodiment

One embodiment of the present invention is described below with reference to FIGS. 1 to 5.

In the following description of the present embodiment, a liquid crystal display device includes a transflective type liquid crystal display panel which carries out a display in a transmissive mode and a reflective mode. Note that the present embodiment deals with a liquid crystal display device including a liquid crystal display panel of a normally black mode. In the normally black mode, black is displayed in a condition where no difference in electric potential is occurred between an active matrix substrate and a counter substrate. Note however that the present invention is not limited to such a configuration.

Figure 1:
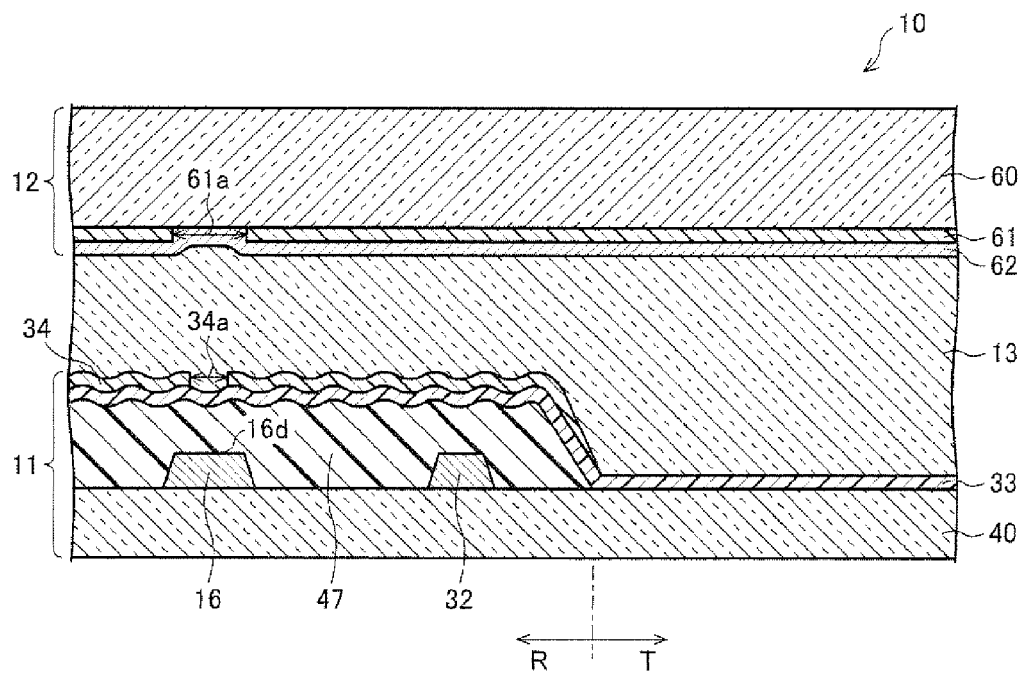
FIG. 1 is a partial cross-sectional view illustrating a configuration of a liquid crystal display device in one embodiment of the present invention.

FIG. 1 shows a schematic structure of a liquid crystal display panel 10 included in the liquid crystal display device of the present embodiment. The liquid crystal display panel includes: an active matrix substrate 11 in which a plurality of pixels are arranged in a matrix; a counter substrate 12 which is arranged so as to face the active matrix substrate 11; and a liquid crystal layer 13, serving as a display medium, which is sandwiched between the active matrix substrate 11 and the counter substrate 12.

Note that, although not illustrated, a rear-side polarization plate and a front-side polarization plate are provided on outer sides of the active matrix substrate 11 and the counter substrate 12, respectively. In the present embodiment, perpendicularly aligned negative type liquid crystal is used as a liquid crystal material. In the present embodiment, the rear-side and front-side polarization plates are arranged so as to be in a relation of crossed nicols. This causes a display mode of the liquid crystal display panel 10 to be a normally black mode.

The liquid crystal display device of the present embodiment includes: the liquid crystal display panel 10 having the above configuration; and a backlight (not illustrated) provided on a back side of the liquid crystal display panel 10.

In the liquid crystal display panel 10, the pixel regions arranged in a matrix includes (i) a reflective display region R in which a display is carried out by reflecting external light and (ii) a transmissive display region T in which a display is carried out by transmitting light emitted from the backlight.

As shown in FIG. 1, the active matrix substrate 11 includes, in each of the pixel regions on the grass substrate 40, components such as (i) a TFT 32 serving as a switching element for driving a pixel and (ii) an optical sensor 16. An organic insulation film (JAS) 47 is provided on the TFT 32 and the optical sensor 16 which are provided in the reflective display region R. A transparent pixel electrode 33, which is made from a material such as ITO (Indium-Tin-Oxide) and IZO (Indium-Zinc-Oxide), is provided on the organic insulation film 47. Further, in the reflective display region R, a reflective electrode (serving as a light shielding layer and a reflective member) 34 is provided on the pixel electrode 33. The reflective electrode 34 is an electrode having a light-reflection function, and is made of metal such as Al or Mo. According to the liquid crystal display device of the present embodiment, the reflective electrode 34 has a minute concavity and convexity shape (see FIG. 1) on its surface so as to avoid an image from reflecting from the reflective electrode.

In the counter substrate 12, a color filter layer 61 and a counter electrode 62 are provided on a grass substrate 60. The color filter layer 61 includes (i) colored sections each having colors of red (R), green (G), and blue (B) and (ii) a black matrix. The color filter layer 61 has an aperture 61a so that the aperture 61a faces the optical sensor 16. This allows the optical sensor to precisely scan an image such as an image of a document placed on the surface of the liquid crystal display panel 10.

According to the liquid crystal display device of the present embodiment, each of the pixel regions thus has an optical sensor, thereby realizing an area sensor. Note that, in the present invention, the optical sensor is not necessarily provided in each of the pixel regions. For example, an optical sensor can be provided in each pixel region having one of the color filters R, G, and B.

Moreover, according to the present embodiment, the reflective electrode 34 serves as a respective light shielding layers for shutting out light which tries to enter the optical sensor 16 in an oblique direction, while the optical sensor 16 is scanning an image such as an image of a document or a fingerprint placed on the surface of the liquid crystal display panel. Further, the reflective electrode 34 has an aperture 34a so that the aperture 34a faces the optical sensor 16 (more specifically, a light receiving section 16d of the optical sensor 16). This allows the optical sensor 16 to detect light from directly above.

With the configuration, the optical sensor 16 can mainly receive light from the surface of the liquid crystal display panel provided directly above the optical sensor 16. This makes it possible to prevent a deterioration in resolution caused by scanning an image obliquely above the optical sensor 16, even though the optical sensor is away, to some extent, from an image of a subject to be scanned, which subject is placed on the surface of the liquid crystal display panel. From this, the present invention can improve the resolution of the optical sensor.

Figure 2:
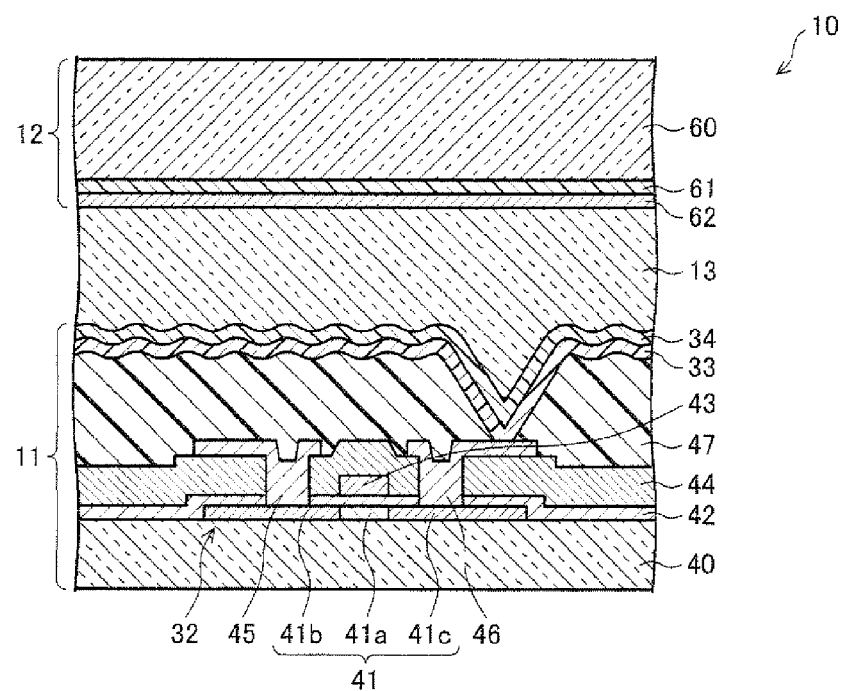
FIG. 2 is a partial cross-sectional view of a liquid crystal display panel included in the liquid crystal display device shown in FIG. 1, illustrating a cross-sectional structure of a TFT section formed in a display region.

The following describes a more specific configuration of a pixel in the liquid crystal display panel 10 of the present embodiment with reference to FIG. 2. FIG. 2 is a partial cross-sectional view of the liquid crystal display panel 10.

As shown in FIG. 2, the liquid crystal display panel 10 is arranged so that the liquid crystal layer 13 is provided between the active matrix substrate 11 and the counter substrate 12. The active matrix substrate 11 includes, in each pixel, (1) the TFT 32 for driving the liquid crystal and (ii) the pixel electrode 33. The TFT has a structure, called "a top gate structure" or "a positive stagger structure", which includes a gate electrode provided above a semiconductor film (polycrystalline Si film) 41 which serves as a channel.

The TFT 32 includes: the polycrystalline Si film 41 provided on the grass substrate 40 serving as a base material; a gate insulation film 42 (such as a silicon oxide film or a silicon nitride film) which is provided so as to cover the polycrystalline Si film 41; a gate electrode 43 (made of a material such as Al, Mo, Ti, or an alloy of the materials) provided on the gate insulation film 42; and an interlayer insulation film 44 (such as a silicon oxide film or a silicon nitride film) which is provided so as to cover the gate electrode 43.

In the polycrystalline Si film 41, a region which faces the gate electrode 43 via the gate insulation film 42 serves as a channel region 41a. Moreover, a region other than the channel region of the polycrystalline Si film 41 is an $n^+$ layer to which an impurity is heavily added, and the region serves as a source region 41b and a drain region 41c. Further, although not illustrated, an LDD (Lightly Doped Drain) region to which an impurity is lightly added is formed on a channel region side of the source region 41b and a channel region side of the drain region 41c, so as to prevent a deterioration in electric properties due to hot-carrier.

A source electrode 45 (made of a material such as Al, Mo, Ti, or an alloy of the materials) is provided on the interlayer insulation film 44. The source electrode 45 is electrically connected with the source region 41b of the polycrystalline Si film 41, via a contact hole which is penetrating through the interlayer insulation film 44 and the gate insulation film 42. Similarly, a drain electrode 46 (made of a material such as Al, Mo, Ti, or an alloy of the materials) is provided on the interlayer insulation film 44. The drain electrode 46 is electrically connected with the drain region 41c of the polycrystalline Si film 41, via a contact hole which is penetrating through the interlayer insulation film 44 and the gate insulation film 42.

The above describes a basic structure of the TFT 32. An organic insulation film (JAS) 47 is further provided in the reflective display region R so as to cover the TFT 32. The pixel electrode 33 is provided on the organic insulation film 47. The pixel electrode 33 is electrically connected with the drain electrode 46, via a contact hole formed in the organic insulation film 47. The reflective electrode 34 is further provided on the pixel electrode 33.

On the other hand, the counter substrate 12 has a structure in which a color filter layer 61 and a counter electrode 62 are stacked in this order on the grass substrate 60 (base material).

Figure 3:
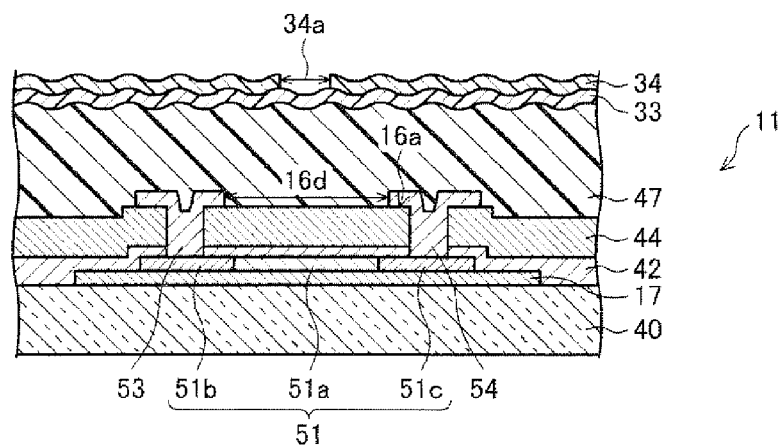
FIG. 3 is a partial cross-sectional view of an active matrix substrate included in the liquid crystal display device shown in FIG. 1, illustrating a cross-sectional structure of an optical sensor element section.

The following describes a more specific configuration of an optical sensor element (optical sensor) 16a of the liquid crystal display panel 10 of the present embodiment with reference to FIG. 3. FIG. 3 is a partial cross-sectional view of the active matrix substrate 11.

The optical sensor element 16a, constituting the optical sensor 16 of the present embodiment, has a structure called "a lateral-structured optical diode" in which a PIN junction of semiconductors is provided in a surface direction (lateral direction) of the substrate.

An optical sensor element 16a is provided in each of the pixel regions of the active matrix substrate 11. As shown in FIG. 3, a light shielding section 17 made of a material such as Al is provided on the grass substrate 40 (base material). The optical sensor element 16a is provided on the light shielding section 17. The optical sensor element 16a includes a PIN diode of a polycrystalline Si film 51. The polycrystalline Si film 51 is formed in the same process at the same time as the polycrystalline Si film 41 constituting the TFT 32. Accordingly, the polycrystalline Si film 41 and the polycrystalline Si film 51 have an identical film thickness.

The PIN junction includes a $p^+$ layer (region 51b) and an layer (region 51c) to which respective impurities are heavily added, and an i layer (region 51a) to which no impurity is added. Note that, instead of the i layer, it is possible to use a $p^+$ layer and an $n^+$ layer alone or in combination.

Further, the gate insulation film 42 and the interlayer insulation film 44 are provided so as to cover the polycrystalline Si film 51 having the PIN junction. The gate insulation film 42 and the interlayer insulation film 44 shown in FIG. 3 are the same as the gate insulation film 42 and the interlayer insulation film 44 for the TFT 32, respectively (see FIG. 3).

A p-side electrode 53 (made of a material such as Al, Mo, Ti, or an alloy of the materials) is provided on the interlayer insulation film 44. The p-side electrode 53 is electrically connected with the $p^+$ region 51b of the polycrystalline Si film 51, via a contact hole which is penetrating through the interlayer insulation film 44 and the gate insulation film 42. Similarly, an n-side electrode 54 (made of a material such as Al, Mo, Ti, or an alloy of the materials) is provided on the interlayer insulation film 44. The n-side electrode 54 is electrically connected with the $n^+$ region 51c of the polycrystalline Si film 51, via a contact hole which is penetrating through the interlayer insulation film 44 and the gate insulation film 42. Note that the p-side electrode 53 and the n-side electrode 54 are formed from a source metal which constitutes a data signal line and a source electrode. The p-side electrode 53 and the n-side electrode 54 have a part exposed in the surface of the interlayer insulation film 44. The part serves as a light receiving part (photoelectric converter) 16d of the optical sensor element 16a.

Note that the contact hole, in the optical sensor element 16a, which penetrates through the interlayer insulation film 44 and the gate insulation film 42 is formed in the same process at the same time as the contact hole, in the TFT 32, which penetrates through the interlayer insulation film 44 and the gate insulation film 42. Moreover, The p-side electrode 53 and the n-side electrode 54 are formed in the same process at the same time as the source electrode 45 and the drain electrode 46 of the TFT 32 are formed. Note that, in the structure shown in FIG. 3, each of parietal sections of the p-side electrode 53 and the n-side electrode 54 has a recessed part for improving adhesiveness to the organic insulation film 47. Note however that such recessed parts are not necessarily provided.

Moreover, the organic insulation film (JAS) 47 is further provided on the optical sensor element 16a so as to cover the optical sensor element 16a. The pixel electrode 33 is provided on the organic insulation film 47. The reflective electrode 34 is further provided on the pixel electrode 33. In the present embodiment, the reflective electrode 34 has an aperture 34a so that the optical sensor element 16a can detect light from directly above.

The above describes a basic structure of the optical sensor element 16a. Basically, the optical sensor element 16a includes the same components as those of the TFT 32. Further, the production processes of the optical sensor element 16a and the TFT 32 are common to each other. This causes the TFT 32 and the optical sensor element 16a to be monolithically formed in the active matrix substrate 11.

Figure 4:
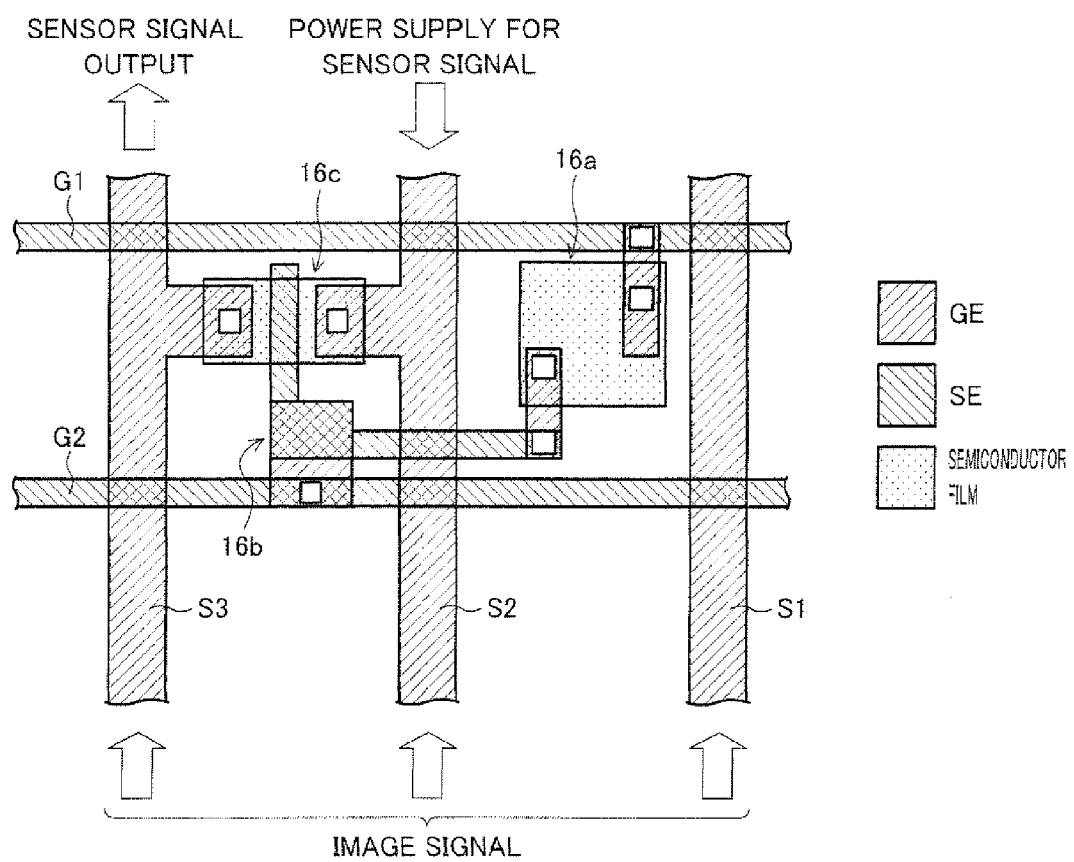
FIG. 4 is a plain schematic view illustrating a circuit structure of an optical sensor included in the liquid crystal display device shown in FIG. 1.

The following describes a configuration for reading out light detected by the optical sensor 16 with reference to FIG. 4. FIG. 4 is a view illustrating a circuit configuration of the optical sensor 16.

As shown in FIG. 4, in a circuit of the optical sensor 16, the optical sensor element 16a, a capacitor 16b, and a transistor (TFT) 16c are connected with each other. The optical sensor element 16a and the capacitor 16b are connected to sensor-driving wires G1, G2, .... Moreover, the transistor 16c is connected to data wires S1, S2, S3, ... which send image signals from a source driver to the respective pixel electrodes 33.

The sensor-driving wires G1 and G2 are formed from the same gate metal as a gate electrode and a scan wire. In FIG. 4, (i) parts formed from the gate metal are indicated by hatching "GE" shown in FIG. 4, (ii) parts formed from the same source metal as a source electrode and a data wire, etc. are indicated by hatching "SE" shown in FIG. 4, and (iii) parts formed from a semiconductor film are indicated by hatching "Semiconductor Film" shown in FIG. 4.

According to the optical sensor 16 having the configuration, the data wire S2 connected to a source of the transistor 16c supplies a power supply voltage for a sensor signal, and the data wire S3 connected to a drain of the transistor 16c outputs the sensor signal. The data wires S1, S2, S3, ... serve as image signal lines as well as sensor signal lines.

More specifically, as shown in FIG. 4, a positive electrode of the optical sensor element 16a is connected to one of terminals of the capacitor 16b, whereas a negative electrode of the optical sensor element 16a is connected to the sensor-driving wiring G1 via which a reset signal is supplied. The other of the terminals of the capacitor 16b is connected to the sensor-driving wire G2 via which a read-out signal is supplied. Moreover, a gate terminal of the transistor 16c is connected to a branch-off wire, which is branched off from the main wire connecting the optical sensor element 16a with the one of the terminals of the capacitor 16b. A voltage at a connecting node of the branch-off wire and the main wire is indicated by a "Vint".

Further, the source of the transistor 16c is connected to the data wire S2, and the drain of the transistor 16c is connected to the data wire S3. The data wire S2 is used also for applying a power supply voltage to the source of the transistor 16c. The data wiring S3 is also used as an output line for a light-receiving signal. Note that, in FIG. 4, the capacitor 16b indicates a parasitic capacity formed between the counter substrate and respective of the optical sensor 16 and the pixel.

According to the optical sensor 16 having the circuit configuration shown in FIG. 4, when a reset signal (e.g., level: 0 [V]) is supplied, the Vint becomes 0 [V], and charge accumulated by the capacitor 16b is discharged and reset. After that, a negative voltage is applied to the negative electrode of the optical sensor element 16a via the sensor-driving wiring G1. While light is entering the optical sensor element 16a, the capacitor 16b is charged. This causes the Vint to be decreased. In a case where the read-out signal is supplied in this situation, the voltage of the Vint rapidly increases beyond a threshold voltage of the transistor 16c, and ultimately becomes a voltage corresponding to an amount of charge accumulated by the capacitor 16b. This causes a channel of the transistor 16c to be opened, and a current flows in the channel in accordance with the Vint thus increased. The current becomes the light-receiving signal.

Figure 5:
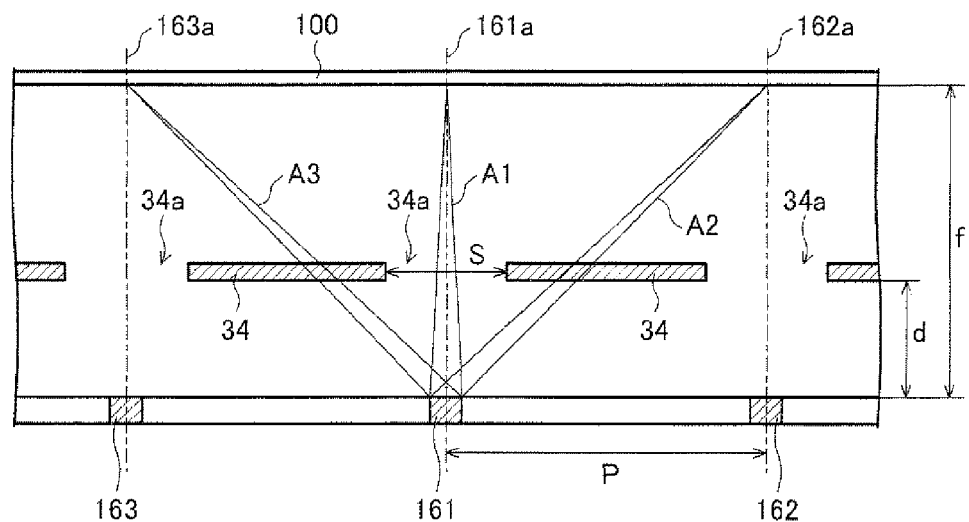
FIG. 5 is a schematic view illustrating a relation between (i) optical sensors adjacent to each other and (ii) a width of an aperture formed in a reflective electrode.

The following describes a preferable width S of the aperture 34a of the reflective electrode 34 with reference to FIG. 5. FIG. 5 is a schematic view illustrating a relation between (i) a distance P between adjacent ones of three optical sensor elements 161, 162, and 163 which are arranged alongside and (ii) the width S of the aperture 34a of the reflective electrode 34.

The optical sensor elements 161, 162, and 163 are adjacently provided in respective three pixel regions which are arranged alongside in a line of the pixel regions arranged in a matrix. The reflective electrodes 34 each serving as the light shielding layer are provided above the respective optical sensor elements, and the apertures 34a are formed directly above the respective light-receiving sections of the optical sensor elements.

Assuming that: a distance between the adjacent optical sensor elements is P; a width of the aperture 34a in the same direction as a direction in which the optical sensor elements are arranged is S; a distance between the surface of the liquid crystal display panel 10 and the optical sensor element is f; and a distance between the reflective electrode (light shielding layer) 34 and the optical sensor element is d, it is preferable that the width S of the aperture 34a falls within the following range.

$$Pd/f \leq S \leq 2Pd/f \quad \text{(Formula 1)}$$

Assuming a triangle whose (i) apex corresponds to the optical sensor element 161 and (ii) bottom corresponds to the width S, the upper limit 2Pd/f in Formula 1 equals to a bottom of a similar triangle having three apexes, i.e., the optical sensor element 161, and positions 162a and 163a of a document 100 to be scanned. In a case where the upper limit of the width S is set to the value 2Pd/f, the reflective electrodes 34 can shut out light (A2 and A3) from directly above the optical sensor elements 162 and 163 arranged next to the optical sensor element 161.

Moreover, the lower limit Pd/f in Formula 1 is half of the upper limit. In a case where the lower limit of the width S is set to the value Pd/f, the optical sensor element 161 can certainly detect light from an area to be scanned of the panel surface (i.e., light entered mainly from a region directly above the optical sensor element).

More specifically, if the width S is set so as to be smaller than the lower limit Pd/f, it is not possible to have an effect of improving a resolution, in view of geometric optics. The lower limit Pd/f is also a minimum value which allows each of the optical sensors to have its own area in which it should partially recognize an image on the panel surface so that the entire area to be recognized can be completely recognized. In a case where the width S is designed to be the lower limit Pd/f, the area from which each of the optical sensors receives light is the same as an area defined by the distance P (the distance between adjacent two optical sensors). Accordingly, even when the width S is smaller than Pd/f, areas on the panel surface from which areas adjacent two of the optical sensors receive light do not overlap each other.

In contrast, in a case where the width S is larger than the lower limit Pd/f, the areas, from which adjacent two of the optical sensors receive light, start to overlap each other. Further, in a case where the width S is larger than the upper limit 2Pd/f, areas, from which (i) an optical sensor and (ii) an optical sensor geometric-optically next to the adjacent optical sensor (i.e., an n-th optical sensor and an (n+2)-th optical sensor) receive light, start to overlap each other. That is, in a case where the width S is larger than the upper limit 2Pd/f, the areas, from which (i) the optical sensor and (ii) the optical sensor geometric-optically next to the adjacent optical element sensor receive light, overlap each other, thereby causing a deterioration in resolution.

With the configuration, the following effects can be achieved. Specifically, in a case where the width S is Pd/f or more, (i) it is possible to improve a resolution and (ii) the optical sensors can completely detect light via the entire panel surface. Furthermore, in a case where the width S is 2Pd/f or less, (i) it is possible to prevent an optical sensor from receiving light from the panel surface directly above its adjacent optical sensor and (ii) it is possible to prevent areas, from which (i) an optical sensor and (ii) an optical sensor geometric-optically next to the adjacent optical sensor receive light, from overlapping each other. This allows an improvement in resolution of the optical sensors.

As described above, according to the liquid crystal display device of the present embodiment, the optical sensors are provided in the respective reflective display regions, and the reflective electrodes are used as respective light shielding layers. With the configuration, it is possible to prevent an aperture ratio of each pixel of the liquid crystal display panel from being damaged by provision of the optical sensors. Accordingly, a display quality of the liquid crystal display device can be secured. Moreover, since the reflective electrodes formed in the respective reflective display regions can be used as the respective light shielding layers, it is not necessary to provide separate light shielding layers.

Second Embodiment

A second embodiment of the present invention is described below with reference to FIGS. 6 to 9.

In the following description of the present embodiment, a liquid crystal display device includes a transmissive type liquid crystal display panel which carries out a display with use of a backlight. Note that the present embodiment deals with a liquid crystal display device including a liquid crystal display panel of a normally black mode. In the normally black mode, black is displayed in a condition where no difference in electric potential is occurred between an active matrix substrate and a counter substrate. Note however that the present invention is not limited to such a configuration. Moreover, in the present embodiment, for convenience of explanation, members having the same configurations and functions as those of the liquid crystal display device of the first embodiment are given the same name and the same reference numerals, and explanations of the members are omitted.

Figure 7:
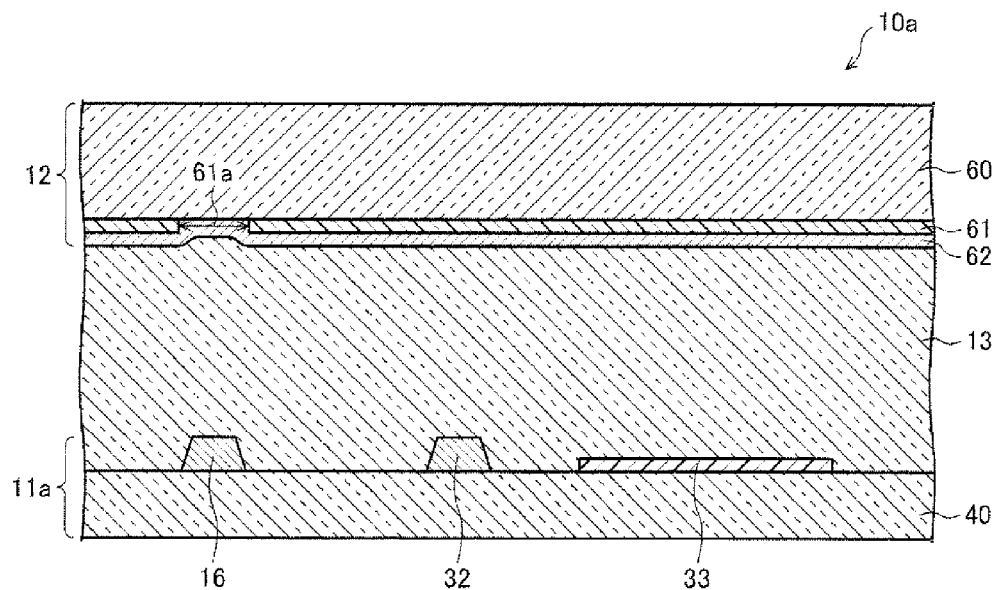
FIG. 7 is a partial cross-sectional view illustrating a configuration of the liquid crystal display device in the second embodiment of the present invention.

FIG. 7 shows a schematic structure of a liquid crystal display panel 10a included in the liquid crystal display device of the present embodiment. The liquid crystal display panel 10a includes: an active matrix substrate 11a in which a plurality of pixels are arranged in a matrix; a counter substrate 12 which is arranged so as to face the active matrix substrate 11a; and a liquid crystal layer 13, serving as a display medium, which is sandwiched between the active matrix substrate 11a and the counter substrate 12.

Note that, although not illustrated, a rear-side polarization plate and a front-side polarization plate are provided on outer sides of the active matrix substrate 11a and the counter substrate 12, respectively. In the present embodiment, perpendicularly aligned negative type liquid crystal is used as a liquid crystal material. In the present embodiment, the rear-side and front-side polarization plates are arranged so as to be in a relation of crossed nicols. This causes a display mode of the liquid crystal display panel 10a to be a normally black mode.

The liquid crystal display device of the present embodiment includes: the liquid crystal display panel 10a having the above configuration; and a backlight (not illustrated) provided on a back side of the liquid crystal display panel 10a.

As shown in FIG. 7, the active matrix substrate 11a includes, on the grass substrate 40, elements such as (i) a TFT 32 as a switching element for driving a pixel and (ii) an optical sensor 16, and (iii) a pixel electrode 33. The pixel electrode 33 is made from a material such as ITO (Indium-Tin-Oxide) or IZO (Indium-Zinc-Oxide).

In the counter substrate 12, a color filter layer 61 and a counter electrode 62 are provided on a grass substrate 60. The color filter layer 61 includes (i) colored sections each having colors of red (R), green (G), and blue (B), and (ii) a black matrix. The color filter layer 61 has an aperture 61a so that the aperture 61a faces the optical sensor 16. This allows the optical sensor to precisely scan an image such as an image of a document placed on the surface of the liquid crystal display panel 10.

According to the liquid crystal display device of the present embodiment, each of the pixel regions thus has an optical sensor, thereby realizing an area sensor.

Figure 8:
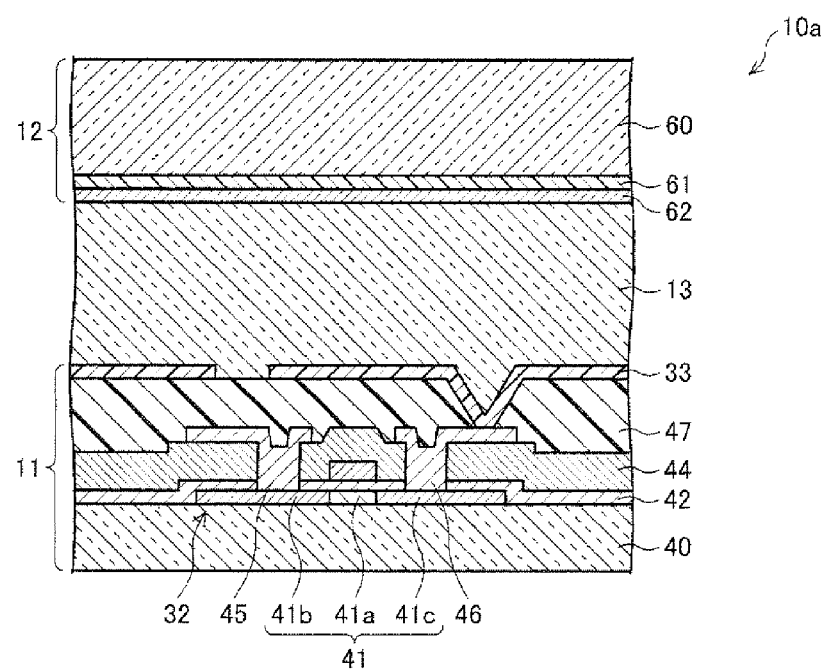
FIG. 8 is a partial cross-sectional view of a liquid crystal display panel included in the liquid crystal display device shown in FIG. 7, illustrating a cross-sectional structure of a TFT section formed in a display region.

FIG. 8 shows a specific configuration of the TFT 32 and the pixel electrode 33 in the liquid crystal display panel 10a of the present embodiment. The following only describes points different from the liquid crystal display device of the first embodiment.

The liquid crystal display device of the present embodiment is a transmissive type liquid crystal display device whose display region of the display panel is entirely a transmissive display region. Accordingly, there is no reflective display region, unlike the liquid crystal display panel 10 of the first embodiment. That is, as is clear from a comparison between FIG. 8 and FIG. 2, the organic insulation film (JAS) 47 provided on the TFT 32 (i) has a smaller thickness in the liquid crystal display panel 10a of the present embodiment than in the liquid crystal display panel 10, and (ii) has no concavity and convexity. The pixel electrode 33 is provided on the flat organic insulation film 47. The pixel electrode 33 is electrically connected to the drain electrode 46, via a contact hole formed in the organic insulation film 47. Note that the liquid crystal display panel 10a of the present embodiment includes no reflective electrode.

Figure 6:
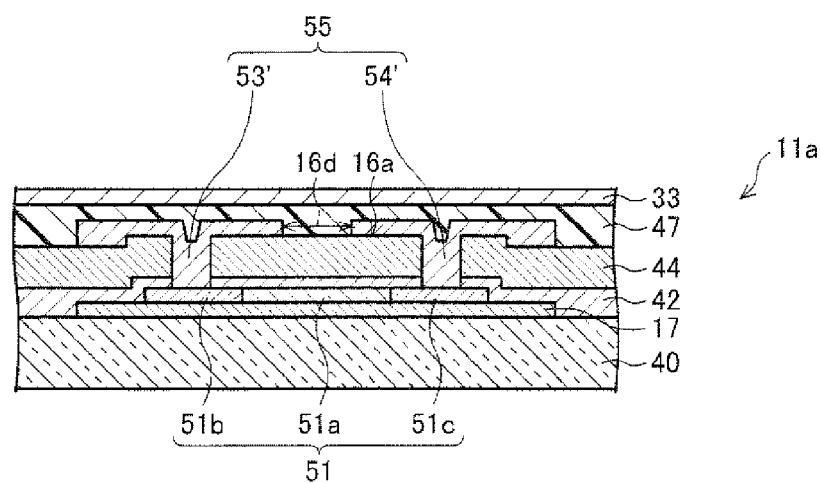
FIG. 6 is a partial cross-sectional view of an active matrix substrate included in a liquid crystal display device in a second embodiment of the present invention, illustrating a configuration of an optical sensor element section.

The following describes a more specific configuration of the optical sensor element 16a in the liquid crystal display panel 10a of the present embodiment with reference to FIG. 6. Note that the following only describes parts different from the liquid crystal display device of the first embodiment.

As is the case with the peripheral configuration of the TFT 32 and the pixel electrode 33, the organic insulation film (JAS) 47 provided on the optical sensor element 16a (i) has a smaller thickness in the liquid crystal display panel 10a of the present embodiment, than in the liquid crystal display panel 10, and (ii) has no concavity and convexity. The pixel electrode 33 is provided on the flat organic insulation film 47.

In the present embodiment, a p-side electrode (a metal layer) 53' and an n-side electrode (a metal layer) 54', which are formed from a source metal, serve as respective light shielding layers 55 for shutting out light which tries to enter the optical sensor 16 in an oblique direction, while the optical sensor 16 is scanning an image such as an image of document or a fingerprint placed on the surface of the liquid crystal display panel. Further, a space between the p-side electrode 53' and the n-side electrode 54' serves as the light-receiving section 16d of the optical sensor 16. An opening (aperture) 55a is formed in the space (the light-receiving section 16d) so that the optical sensor 16 can detect light from directly above.

As is clear from a comparison between FIG. 6 and FIG. 3, the p-side electrode 53' and the n-side electrode 54' of the present embodiment serve as the respective light shielding layers 55. As such, the p-side electrode 53' and the n-side electrode 54' of the present embodiment are more extensively provided, as compared with the p-side electrode 53 and the n-side electrode 54 of the first embodiment. Moreover, a width of the aperture 55a in which the light-receiving section 16d is formed is smaller, as compared with the first embodiment.

With the configuration, the optical sensor 16 can mainly receive light from the surface of the liquid crystal display panel provided directly above the optical sensor 16. This makes it possible to prevent a deterioration in resolution caused by scanning an image obliquely above the optical sensor 16, even though the optical sensor is away, to some extent, from an image of a subject to be scanned, which subject is placed on the surface of the liquid crystal display panel. From this, the present invention can improve the resolution of the optical sensor.

According to the present embodiment, as is the case with the first embodiment, the circuit of the optical sensor 16 includes the optical sensor element (optical sensor) 16a having the above configuration, a capacitor, and a transistor (TFT). It is possible to read out, as a sensor signal, the light detected by the optical sensor element 16a.

The following describes an example as to how the light shielding layers 55 are arranged on the optical sensor element 16a with reference to FIG. 9. (a) and (b) of FIG. 9 are plain schematic views illustrating shapes of the light shielding layers 55, each of which includes the p-side electrode 53' and the n-side electrode 54', provided on the polycrystalline Si film 51 (PIN diode) constituting the optical sensor element 16a. Note that, in (a) and (b) of FIG. 9, regions, where the light shielding layers 55 are formed, are hatched.

As shown in (a) and (b) of FIG. 9, the p-side electrode 53' is formed so as to cover a p+ layer (a region 51b) of the polycrystalline Si film 51, and the n-side electrode 54' is formed so as to cover an n+ layer (a region 51c) of the polycrystalline Si film 51. Note that the p-side electrode 53' and the n-side electrode 54' are formed from the source metal from which members such as the data signal line and the source electrode are formed.

Further, in the configuration shown in (a) of FIG. 9, the p-side electrode 53' and the n-side electrode 54' are arranged so as to be away from each other by a constant distance (the width S). The light shielding layers 55 (p-side electrode 53' and the n-side electrode 54') are provided so that only the i+ layer 51a which is a central part of the polycrystalline Si film 51 is exposed. This leads to a reduction in amount of light which enters the light receiving section 16d of the optical sensor element 16a in an oblique direction with respect to the width S direction. This allows each of the optical sensors 16 to mainly detect the light from almost directly above while scanning an image of the surface of the liquid crystal display panel. As such, it is possible to improve a resolution of each of the optical sensors.

Moreover, in the configuration shown in (b) of FIG. 9, the p-side electrode 53' and the n-side electrode 54' are arranged so as to be away from each other (i) by the width S in a central part of the polycrystalline Si film 51 and (ii) by a narrower distance than the width S in peripheral parts. With the configuration, not only areas in the width S direction, but also most of areas in a direction perpendicular to the width S direction are covered with the light shielding layers 55. This allows more light from oblique directions to be shut out. As such, the configuration of (b) of FIG. 9 allows an improvement in resolution of each of the optical sensors.

Note that a preferable range of the width S is the same as the first embodiment as follows.

$$Pd/f \leq S \leq 2Pd/f \quad \text{(Formula 1)}$$

P represents a distance between the adjacent optical sensor elements 16a; f represents a distance between the surface of the liquid crystal display panel 10a and the optical sensor element 16a; and d represents a distance between the light shielding layer 55 and the optical sensor element 16a.

As described above, according to the liquid crystal display device of the present embodiment, since the light shielding layers are formed from the source metal, the light shielding layers can be provided in the vicinity of the respective optical sensors. This makes it possible to reduce an amount of stray light detected by each of the optical sensors. Moreover, since the source metal which is provided, in advance, in the liquid crystal display panel is used as the light shielding layers, it is not necessary to form separate light shielding layers.

The present invention is not limited to the description of the embodiments above, but may be altered by a skilled person within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The invention is applicable to a liquid crystal display device including a display panel in which optical sensors are provided for detecting light on the panel surface. The present invention allows an improvement in resolution of each of the optical sensors.

The invention claimed is:

1. A liquid crystal display device comprising:
a liquid crystal display panel in which a liquid crystal layer is arranged between an active matrix substrate and a counter substrate,
a plurality of optical sensors being provided in respective image display regions of the liquid crystal display panel, each of the optical sensors having a light receiving section for detecting light transmitted through a surface of the liquid crystal display panel,
a light shielding layer being provided above each of the optical sensors so as to shut out light which enters the light receiving section in an oblique direction,
an aperture being provided in a part of each of the light shielding layers, via which aperture each of the optical sensors can detect light which enters each of the light receiving sections from directly above, and
wherein the optical sensors and the light shielding layer are on the active matrix substrate, so that a pixel electrode on the active matrix substrate is located between at least one of the optical sensors and the light shielding layer.

2. A liquid crystal display device comprising:
a liquid crystal display panel in which a liquid crystal layer is arranged between an active matrix substrate and a counter substrate,
a plurality of optical sensors being provided in respective image display regions of the liquid crystal display panel, each of the optical sensors having a light receiving section for detecting light transmitted through a surface of the liquid crystal display panel,
a light shielding layer being provided above each of the optical sensors so as to shut out light which enters the light receiving section in an oblique direction, and
an aperture being provided in a part of each of the light shielding layers, via which aperture each of the optical sensors can detect light which enters each of the light receiving sections from directly above, and wherein:
the liquid crystal display panel is a transflective type panel;
the optical sensors are provided in respective reflective display regions; and reflective electrodes provided in the respective reflective display regions serve as the respective light shielding layers.

3. The liquid crystal display device as set forth in claim 1, wherein:
the optical sensors are constituted by respective diodes; and
the light shielding layers are respective metal layers which cover the respective diodes and which have respective apertures via which light externally enters parts of the respective diodes.

4. A liquid crystal display device comprising:
a liquid crystal display panel in which a liquid crystal layer is arranged between an active matrix substrate and a counter substrate,
a plurality of optical sensors being provided in respective image display regions of the liquid crystal display panel, each of the optical sensors having a light receiving section for detecting light transmitted through a surface of the liquid crystal display panel,
a light shielding layer being provided above each of the optical sensors so as to shut out light which enters the light receiving section in an oblique direction, and
an aperture being provided in a part of each of the light shielding layers, via which aperture each of the optical sensors can detect light which enters each of the light receiving sections from directly above, and wherein:
the optical sensors are respective PIN diodes in each of which a $p^+$ semiconductor layer, an i semiconductor layer, and an $n^+$ semiconductor layer are arranged in this order: and
the light shielding layers are respective metal layers, each of the metal layers being provided above the $p^+$ layer and the n layer of a corresponding one of the PIN diodes; and the apertures are formed between adjacent ones of the metal layers.

5. The liquid crystal display device as set forth in claim 3, wherein: each of the metal layers is formed from a source metal.

6. A liquid crystal display device comprising:
a liquid crystal display panel in which a liquid crystal layer is arranged between an active matrix substrate and a counter substrate,
a plurality of optical sensors being provided in respective image display regions of the liquid crystal display panel, each of the optical sensors having a light receiving section for detecting light transmitted through a surface of the liquid crystal display panel,
a light shielding layer being provided above each of the optical sensors so as to shut out light which enters the light receiving section in an oblique direction, and
an aperture being provided in a part of each of the light shielding layers, via which aperture each of the optical sensors can detect light which enters each of the light receiving sections from directly above, and wherein:
a width S is Pd/f or more but 2Pd/f or less,
where S is a width of each of the apertures, f is a distance between the surface of the liquid crystal display panel and each of the optical sensors, d is a distance between the respective light shielding layers and the respective optical sensors; and P is a distance between adjacent two of the optical sensors.

7. The liquid crystal display device as set forth in claim 4, wherein: each of the metal layers is formed from a source metal.

* * * * *